United States Patent
Kurosawa

(10) Patent No.: US 6,870,599 B2
(45) Date of Patent: Mar. 22, 2005

(54) EXPOSURE METHOD AND APPARATUS, AND DEVICE MANUFACTURING METHOD

(75) Inventor: Hiroshi Kurosawa, Chiba (JP)

(73) Assignee: Canon Kabushiki Kaisha, Tokyo (JP)

( * ) Notice: Subject to any disclaimer, the term of this patent is extended or adjusted under 35 U.S.C. 154(b) by 177 days.

(21) Appl. No.: 10/050,581

(22) Filed: Jan. 18, 2002

(65) Prior Publication Data

US 2002/0145716 A1 Oct. 10, 2002

(30) Foreign Application Priority Data

Jan. 29, 2001 (JP) .................................. 2001-020683

(51) Int. Cl.⁷ .................. G03B 27/42; G03B 27/68; G01B 11/00
(52) U.S. Cl. ..................... 355/53; 355/52; 356/399
(58) Field of Search .................... 355/52, 53, 55; 356/399, 400, 401; 430/5

(56) References Cited

U.S. PATENT DOCUMENTS

| | | | |
|---|---|---|---|
| 5,182,615 A | 1/1993 | Kurosawa et al. | 356/400 |
| 5,898,477 A | 4/1999 | Yoshimura et al. | 355/53 |
| 5,914,773 A | 6/1999 | Kurosawa et al. | 355/53 |
| 6,128,067 A * | 10/2000 | Hashimoto | 355/52 |
| 6,204,911 B1 | 3/2001 | Kurosawa et al. | 355/53 |
| 6,228,561 B1 * | 5/2001 | Hasebe et al. | 430/311 |
| 6,262,792 B1 * | 7/2001 | Higashiki | 355/52 |
| 6,268,903 B1 * | 7/2001 | Chiba et al. | 355/53 |
| 6,304,316 B1 * | 10/2001 | Jain et al. | 355/53 |
| 6,549,271 B2 * | 4/2003 | Yasuda et al. | 355/55 |

* cited by examiner

Primary Examiner—Alan Mathews
(74) Attorney, Agent, or Firm—Fitzpatrick, Cella, Harper & Scinto

(57) ABSTRACT

A scanning exposure apparatus is provided that is capable of increasing the overlay accuracy. Every time a reticle is exchanged, a direction overlay correction table is updated. A control device for the exposure apparatus corrects the target positions (target locus) of a wafer stage on the basis of the direction overlay correction table.

19 Claims, 13 Drawing Sheets

FIG. 6

| ORIGIN | −16.000 | [mm] |
|---|---|---|
| INTERVAL | 4.000 | [mm] |

CORRECTION DATA     [nm/ppb]
(FORWARD)

| X | Y | Z | Qx | Qy | Qz |
|---|---|---|---|---|---|
| 5 | 1 | 10 | 0 | −10 | 20 |
| 4 | 1 | 8 | 10 | −10 | 10 |
| 2 | 0 | 10 | 20 | 20 | 10 |
| 1 | −1 | 12 | 20 | 40 | 10 |
| −1 | −4 | 13 | 20 | 30 | 0 |
| −4 | −2 | 10 | 40 | 40 | −10 |
| −3 | −4 | 7 | 10 | 50 | −30 |
| −6 | −5 | 4 | 0 | 80 | −30 |
| −12 | −9 | 0 | −20 | 60 | −40 |

(REVERSE)

| X | Y | Z | Qx | Qy | Qz |
|---|---|---|---|---|---|
| 4 | 0 | 9 | 10 | −10 | 20 |
| 2 | 0 | 6 | 0 | 0 | 10 |
| 0 | −1 | 11 | 10 | 10 | 10 |
| 0 | −1 | 11 | 20 | 30 | 20 |
| −3 | −4 | 10 | 40 | 10 | 0 |
| −5 | −3 | 9 | 20 | 40 | −10 |
| −5 | −4 | 6 | 20 | 60 | −30 |
| −7 | −5 | 4 | 10 | 100 | −30 |
| −14 | −9 | −1 | 0 | 80 | −30 |

SEMICONDUCTOR DEVICE MANUFACTURING FLOW

EXPOSURE METHOD AND APPARATUS, AND DEVICE MANUFACTURING METHOD

FIELD OF THE INVENTION

The present invention relates to an exposure method and apparatus and a device manufacturing method and, more particularly, to an exposure method and apparatus for transferring a master pattern onto a substrate while moving a controlled element concerning exposure operation on the basis of a target locus, and a device manufacturing method.

BACKGROUND OF THE INVENTION

There is a scanning exposure apparatus for projecting part of a master pattern onto a substrate via a projection optical system, and scanning the master and substrate perpendicularly to the optical axis of the projection optical system, thereby transferring the master pattern to the substrate. This scanning exposure apparatus adopts a method of correcting target positions for all the axes of a substrate stage for holding a substrate or those of a master stage for holding a master in accordance with a polynomial whose variable is the position, along the scan axis, of the substrate or master stage in a coordinate system defined using the center of an exposure shot on the substrate or the center of the master pattern as an origin.

With micropatterning of semiconductor integrated circuits, an insufficient overlay (alignment) accuracy within a shot is becoming typical when different types of exposure apparatuses are used in mix-and-match. That is, only the function of faithfully transferring a master pattern onto a substrate is not satisfactory. Demands are arising for deforming a master pattern in accordance with the distortion within a shot on a layer already formed on a substrate and transferring the master pattern onto the substrate.

In recent years, a pellicle is generally attached to a master in order to prevent a projected image from being deteriorated by contamination of a master. However, adding a pellicle to a master mechanically distorts the master, which distorts the master pattern. An overlay error by the distortion of a master pattern is also increasing to a non-negligible degree.

However, the conventional method cannot cope with changes in combinations of exposure apparatuses or the distortion of a master pattern because the target position of the master or substrate stage is corrected in accordance with a fixed polynomial. The conventional method, therefore, suffers from a low overlay accuracy.

SUMMARY OF THE INVENTION

The present invention has been made in consideration of the above situation, and has as its object to increase the overlay accuracy.

According to the first aspect of the present invention, there is provided an exposure method of transferring a master pattern onto a substrate while moving a controlled element concerning exposure operation on the basis of a target locus, comprising the correction step of correcting the target locus on the basis of correction information prepared in correspondence with the master, and the transfer step of transferring the master pattern onto the substrate while moving the controlled element toward the corrected target locus.

The correction information includes, e.g., information corresponding to a shape characteristic (e.g., distortion) of the master pattern and/or information corresponding to a shape characteristic (e.g., distortion) of a pattern already formed on the substrate.

The controlled element includes, e.g., a stage which moves while holding the substrate or the master in an exposure operation, and in the transfer step, the master pattern is transferred onto the substrate by a scanning exposure method while the stage is moved.

The correction information preferably includes information corresponding to a moving direction of the stage and/or information corresponding to a moving speed of the stage.

The correction information is given as, e.g., a set of discrete correction values.

In the correction step, the target locus is corrected on the basis of, e.g., pairs of pieces of correction information. More specifically, the correction step includes, e.g., the steps of synthesizing pairs of pieces of correction information to generate a pair of pieces of correction information, and correcting the target locus on the basis of the synthesized correction information.

According to the second aspect of the present invention, there is provided an exposure method of transferring a master pattern onto a substrate while moving a controlled element concerning exposure operation, comprising transferring the master pattern onto the substrate while moving the controlled element in accordance with a target locus generated in correspondence with a shape characteristic of the master pattern.

According to the third aspect of the present invention, there is provided an exposure method of transferring a master pattern onto a substrate while moving a controlled element concerning exposure operation, comprising transferring the master pattern onto the substrate while moving the controlled element in accordance with a target locus generated in correspondence with a shape characteristic of a pattern already formed on the substrate.

According to the fourth aspect of the present invention, there is provided an exposure method of transferring a master pattern onto a substrate while moving a controlled element concerning exposure operation, comprising transferring the master pattern onto the substrate while moving the controlled element in accordance with a target locus generated in correspondence with a shape characteristic of the mask pattern and a shape characteristic of a pattern already formed on the substrate.

According to the fifth aspect of the present invention, there is provided an exposure apparatus for transferring a master pattern onto a substrate while moving a controlled element concerning exposure operation on the basis of a target locus, comprising a correction unit for correcting the target locus on the basis of correction information prepared in correspondence with the master, and a transfer unit for transferring the master pattern onto the substrate while moving the controlled element toward the target locus corrected by the correction unit.

According to the sixth aspect of the present invention, there is provided a device manufacturing method comprising the coating step of coating a substrate with a resist, the exposure step of transferring a master pattern onto the substrate coated with the resist by the above exposure method, and the developing step of developing the substrate bearing the pattern.

According to the sixth aspect of the present invention, there is provided a device manufacturing method comprising the first coating step of coating a substrate with a first resist, the first exposure step of transferring a first master pattern onto the substrate coated with the first resist, the first developing step of developing the substrate bearing the first master pattern, the second coating step of coating the developed substrate with a second resist, the second exposure step of transferring a second master pattern onto the substrate coated with the second resist, and the second developing step of developing the substrate bearing the second master pattern. The second exposure step includes the correction step of correcting a target locus of a controlled element concerning exposure operation on the basis of correction information corresponding to a shape characteristic of the second master pattern and/or a shape characteristic of a pattern formed on the substrate after the first developing step, and the transfer step of transferring the second master pattern onto the substrate while moving the controlled element toward the corrected target locus.

The device manufacturing method according to the sixth aspect of the present invention is preferable when different types of exposure apparatuses are used in the first and second exposure steps.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 6 is a view showing an example of a direction overlay correction table;

DETAILED DESCRIPTION OF THE PREFERRED EMBODIMENTS

Preferred embodiments of the present invention will be described below with reference to the accompanying drawings.

Figure 1:
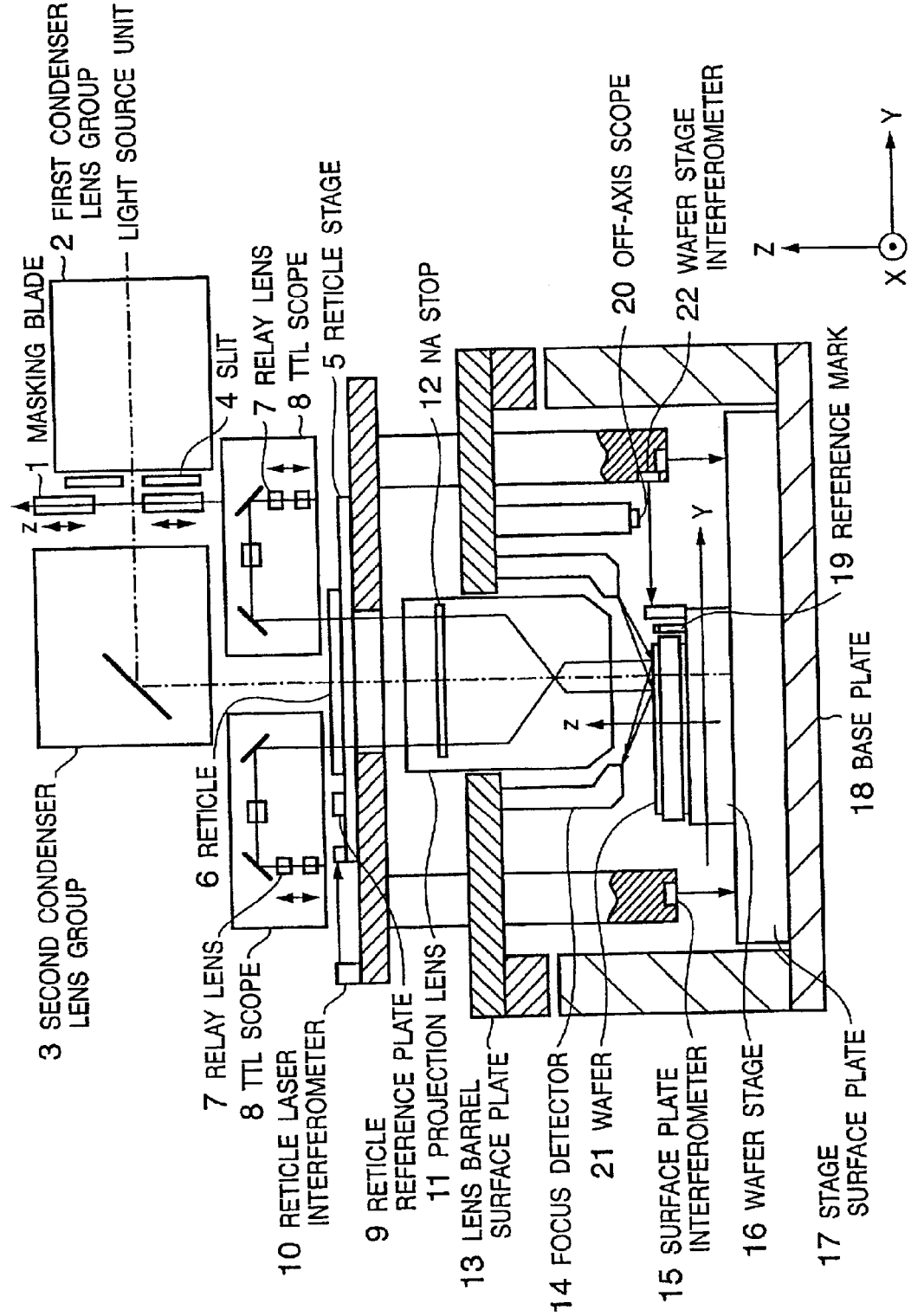
FIG. 1 is a sectional view showing the schematic structure of a scanning exposure apparatus according to a preferred embodiment of the present invention.

FIG. 1 is a sectional view showing the schematic structure of a scanning exposure apparatus according to a preferred embodiment of the present invention. Exposure light emitted by a light source unit such as an excimer laser reaches a slit 4 via a first condenser lens group 2. The slit 4 narrows down the exposure light to a slit-like beam with a width of about 7 mm in the Z direction. Further, the slit 4 adjusts the illuminance integrated in the Z direction to be uniform over a predetermined range in the X-axis direction. A masking blade 1 moves following the end of the pattern drawing field angle of a reticle (master) 6 in exposure by scanning a reticle stage (master stage) 5 and a wafer stage (substrate stage) 16. The masking blade 1 prevents exposure light from entering the light-transmitting portion of the reticle 6 and reaching a wafer 21 while the reticle stage 5 decelerates after the end of pattern transfer onto the reticle 6. The exposure light having passed through the masking blade 1 irradiates the reticle 6 on the reticle stage 5 via a second condenser lens group 3. The exposure light having passed through the pattern of the reticle 6 forms the imaging plane of the pattern near the surface of the wafer (substrate) 21 via a projection lens 11. The projection lens 11 incorporates an NA stop 12 which can change the illumination mode in exposure.

One-dimensionally movable TTL scopes 8 measure the X-, Y- and Z-axis positions of an alignment mark formed on a reference mark 19 on the reticle 6, wafer 21, or wafer stage 16 on the basis of the absolute position references of the TTL scopes 8. Relay lenses 7 are used to adjust the focuses of the TTL scopes 8. The focus of an object to be detected (position in the Z-axis direction) can be measured by referring to the positions of the relay lenses 7 while the alignment mark is in the best in-focus state. In FIG. 1, two TTL scopes 8 are arranged in the Y direction for illustrative convenience. In practice, another TTL scope is arranged in the X direction. This arrangement enables measuring tilts in ωx and ωy directions between the reticle alignment mark and the wafer 21 or reference mark 19. The TTL scopes 8 shown in FIG. 1 can be driven toward the center of a field angle (Y-axis direction).

The reticle stage 5 is controlled in the X, Y, and θ directions by using three reticle laser interferometers 10. Only one reticle laser interferometer 10 is shown in FIG. 1, but two reticle laser interferometers 10 along the Y-axis and one reticle laser interferometer 10 along the X-axis are arranged in practice. The reticle stage 5 is movable in the X, Y, and θ directions along guides on the lens barrel surface plate 13. As for the Y-axis, the reticle stage 5 can move over a long stroke in order to execute scanning exposure while moving in synchronism with the wafer stage 16. As for the X- and θ-axes, the reticle stage 5 can move only within a small range because it suffices to eliminate an error upon chucking the reticle 6 by the reticle stage 5. In this exposure apparatus, a reaction force upon driving the reticle stage 5 escapes to a reaction force absorption device (not shown)

rigidly connected to a base plate 18. A lens barrel surface plate 13 does not shake in reaction to driving. The reticle stage 5 supports a reference plate 9 on which a mark observable by the TTL scope 8 is drawn.

A focus detector 14 measures the positions of the wafer 21 or reference mark 19 on the wafer stage 16 in the Z, ωx, and ωy directions at a high speed without the mediacy of the projection lens 11 regardless of the presence/absence of the mark. The focus detector 14 is used to detect the focus in exposure during sync scan of the reticle stage 5 and wafer stage 16. To ensure long-term stability of the measurement precision, the focus detector 14 performs self-calibration by comparing the result of measuring the reference mark 19 on the wafer stage 16 by the TTL scope 8 with the result of measuring the reference mark 19 by the focus detector 14.

An off-axis scope 20 has a single-lens focus measurement function and an alignment error measurement function in the X and Y directions. In aligning a wafer in a general mass production job, the off-axis scope 20 executes global tilt measurement and global alignment measurement. The global tilt correction amount and global alignment correction amount are reflected at once when the wafer stage 16 is so stepped as to position the exposure area of a wafer below the projection lens 11.

The lens barrel surface plate 13 is a base for attaching the high-precision measurement device of the exposure apparatus. The lens barrel surface plate 13 is positioned while slightly floating from the base plate 18 directly placed on the floor. The above-described focus detector 14 and TTL scope 8 are attached to the lens barrel surface plate 13, so that the measurement values of these measurement devices are the results of measuring relative distances from the lens barrel surface plate 13. A surface plate interferometer 15 measures the relative positional relationship between the lens barrel surface plate 13 and a stage surface plate 17. In this embodiment, control (to be described with reference to FIG. 6) is executed such that the sum of a measurement result by the surface plate interferometer 15 and a measurement result by a triaxial Z sensor (not shown) mounted on the wafer stage 16 coincides with a target value designated by a host sequence. Thus, the wafer 21 on the wafer stage 16 is maintained with respect to the lens barrel surface plate 13 so as to coincide with the target value designated by the host sequence. Three wafer stage interferometers 22 are arranged, similar to the interferometers for the reticle stage 5, and used to control the wafer stage 16 in the X, Y, and θ directions.

Similar to the lens barrel surface plate 13, the stage surface plate 17 is positioned while slightly floating from the base plate 18. The stage surface plate 17 has a function of removing vibrations transmitted from the floor to the wafer stage 16 via the base plate 18, and a function of reducing a reaction force upon driving the wafer stage 16 and transmitting the force to the base plate 18. The wafer stage 16 is mounted on the stage surface plate 17 while floating by a small distance.

Figure 2:
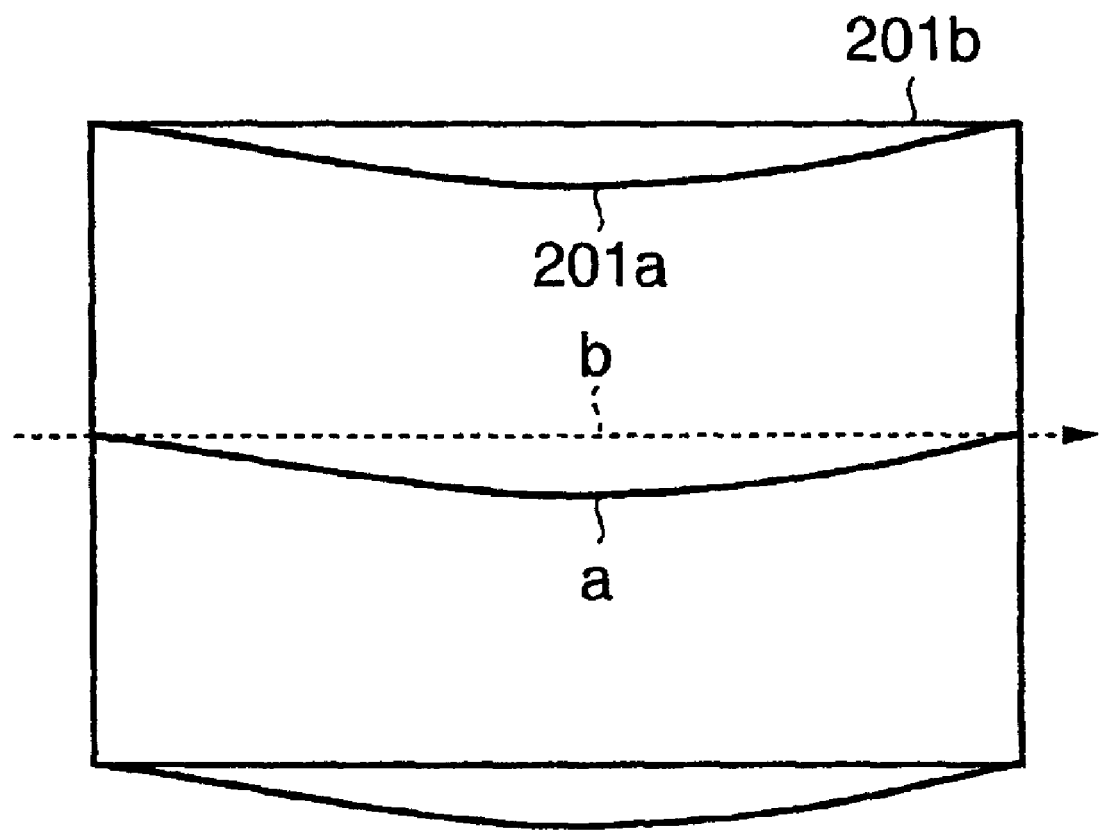
FIG. 2 is a view showing the central locus of an exposure slit when viewed from above a wafer (locus a is obtained when the target value of a wafer stage is corrected in a direction perpendicular to the scan direction by using an overlay error correction table in the preferred embodiment of the present invention, and a locus b is obtained when the target value of the wafer stage is not corrected)

FIG. 2 is a view showing the central locus of an exposure slit (slit-like exposure light projected via the projection lens 11) when viewed from above the wafer 21. In FIG. 2, a locus a is obtained when the target value of the wafer stage 16 is corrected in a direction perpendicular to the scan direction by using an overlay error correction table (overlay correction table) in the preferred embodiment of the present invention. A locus b is obtained when the target value of the wafer stage 16 is not corrected. Outer shot shapes 201a and 201b of the exposure slit are along the loci a and b, respectively. The overlay error correction table provides information for correcting the loci a and b.

Figure 3:
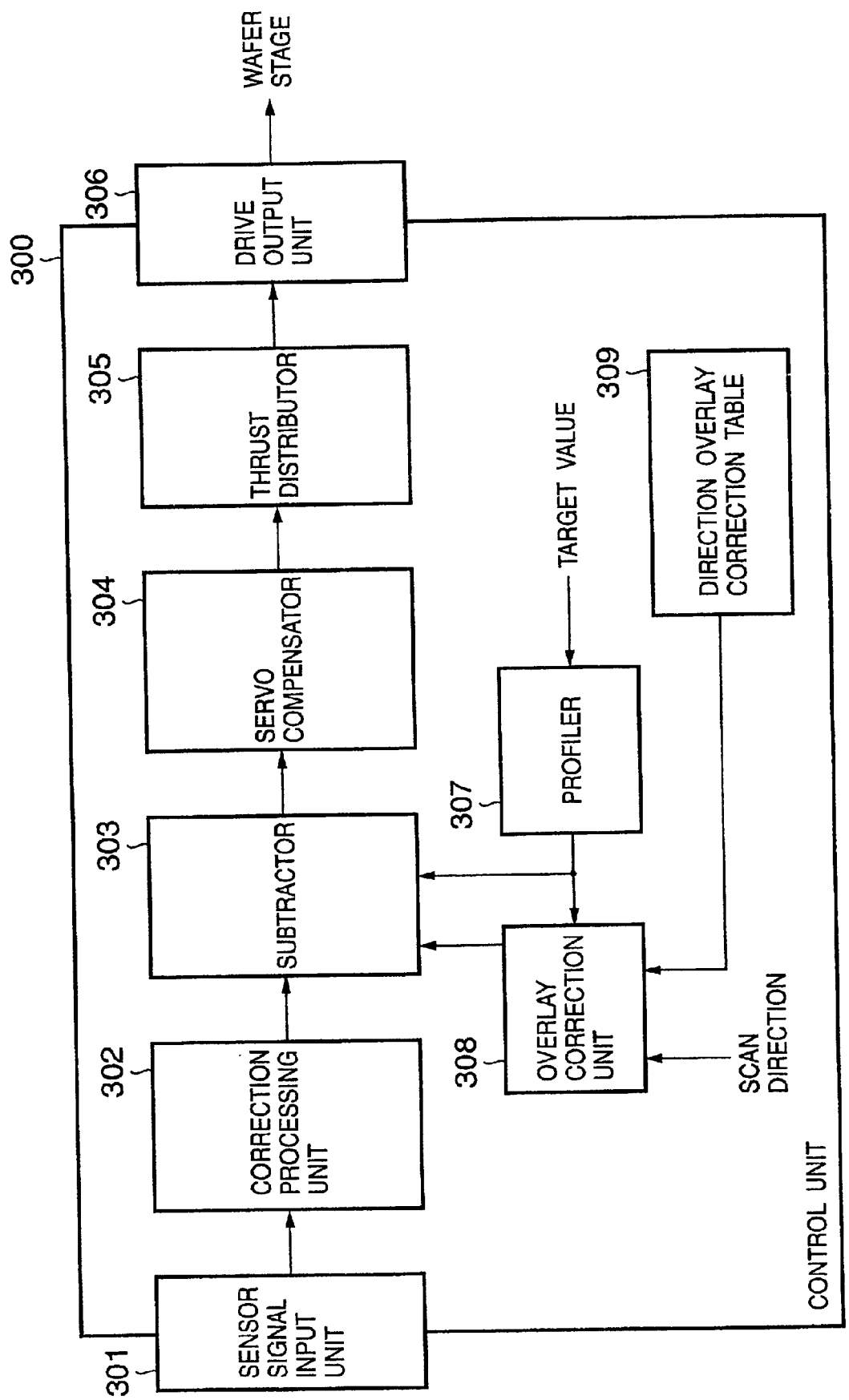
FIG. 3 is a block diagram showing a control unit for controlling the wafer stage shown in FIG. 1.

FIG. 3 is a block diagram showing a control unit for controlling the wafer stage 16 shown in FIG. 1. Outputs from Z sensors mounted on the wafer stage interferometer 22, surface plate interferometer 15, and wafer stage 16 are input to a sensor signal input unit 301. These signals are transferred to a correction processing unit 302 (to be described in detail with reference to FIG. 4) where they receive correction processing such as Abbe correction and orthogonality correction. The corrected signals are output as data representing the current positions of respective axes from the correction processing unit 302.

A profiler 307 smoothes stepwise changes in target value designated by the host sequence so as not to apply acceleration more than a default value to the wafer stage 16. An overlay correction unit 308 determines the coordinates of the center of the exposure slit using the center of the current exposure shot as an origin on the basis of the sequential target positions (target locus) of the wafer stage 16 that are provided by the profiler 307. Further, the overlay correction unit 308 determines a correction amount by referring to a direction overlay correction table in a memory 309 on the basis of the determined coordinates and the scan direction, and outputs the correction amount to a subtractor 303. The subtractor 303 compares the sum (i.e., corrected target position) of a target position provided by the profiler 307 and the correction amount provided by the overlay correction unit 308 with an output (i.e., current position of the wafer stage) from the correction processing unit 302 to calculate the deviation of the current position along each axis from the corrected target position, and sends the deviation to a servo compensator 304.

The servo compensator 304 has a compensator (e.g., a PID controller or notch filter) which considers the mechanical characteristics of the wafer stage 16. An output from the servo compensator 304 is distributed by a thrust distributor 305 as a manipulated variable for a plurality of actuators of the wafer stage 16. The manipulated variable is output to these actuators via a drive output unit 306.

Figure 4:
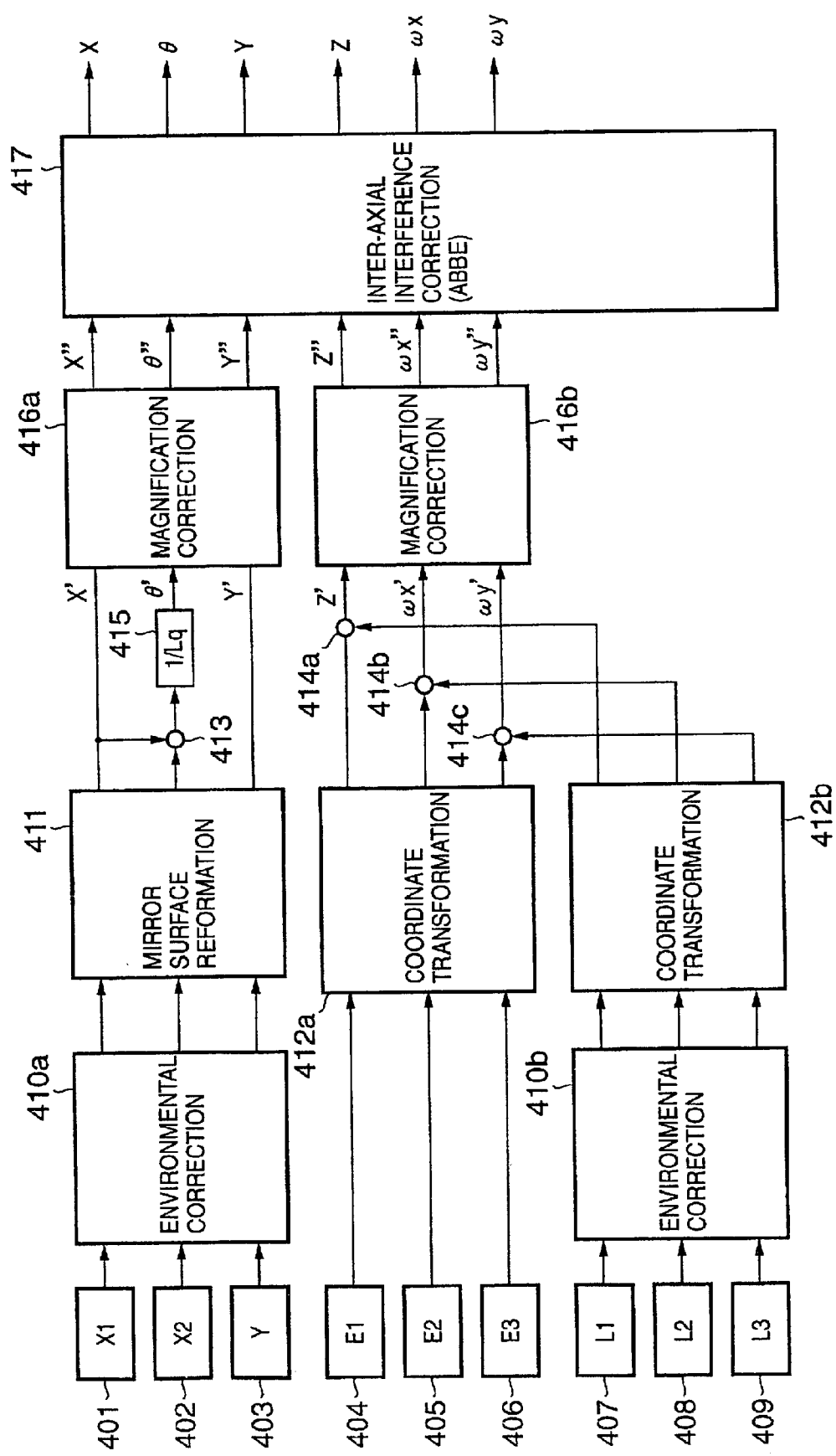
FIG. 4 is a block diagram showing an example of signal processing in a correction processing unit shown in FIG. 3.

FIG. 4 is a block diagram showing an example of signal processing in the correction processing unit 302 shown in FIG. 3. FIG. 4 shows the flow of reading, by a data processing system, outputs (measurement values) from the Z sensors mounted on the wafer stage interferometer 22, surface plate interferometer 15, and wafer stage 16, as described with reference to FIG. 1, and converting these outputs into the current position in the mode-separated abstract coordinate system. Reference numerals 401 to 403 denote measurement values for the respective axes of the wafer stage interferometer 22; 404 to 406, measurement values by the Z sensor of the wafer stage 16; and 407 to 409, measurement values by the surface plate interferometer 15. A laser beam used by each interferometer varies in wavelength under the influence of the atmospheric pressure, temperature, and humidity, so the measurement value of the interferometer must undergo environmental correction (410a and 410b). As an example of the environmental correction method, the measurement value is multiplied by a variable magnification with respect to the reference length by using a wavelength tracker.

Reference numeral 411 denotes mirror surface reformation processing. An interferometer mirror along a long-stroke driving axis such as the X- and Y-axes of the wafer stage 16 is difficult to process into an ideal curvature of 0. Thus, the mirror curvature is corrected by software by a correction value obtained by measuring the mirror flatness (mirror surface reformation). The θ-axis value of the wafer stage 16 is attained by calculating the difference between the measurement value (401) of an X1 interferometer (not shown) and the measurement value (402) of an X2 interferometer (not shown) (413), and dividing (415) the difference by the span (Lq) between the X1 and X2 interferometers. The value attained by this processing is subjected to magnification correction (416a).

The measurement values 404 to 406 of the Z sensor of the wafer stage 16 and the measurement values 407 to 409 of the surface plate interferometer 15 are subjected to coordinate transformation (412a and 412b), added to each other (414a to 414c), and subjected to magnification correction (416b). The sums of the measurement values of the Z sensor of the wafer stage 16 and the measurement values of the surface plate interferometer 15 represent distances between the lens barrel surface plate 13 and the wafer chuck on the wafer stage 16.

The measurement values (X", Y", θ", Z", ωx", and ωy") obtained by these processes undergo inter-axial interference correction (417). Inter-axial interference correction (417) includes Abbe correction of correcting a measurement value error caused by a shift of measurement light of the laser interferometer from a design position on the mirror and a shift of the irradiation angle of measurement light of the laser interferometer from a design angle, and guide flatness correction of correcting the distortion of the guide flatness from the X-Y plane of the wafer stage 16.

Figure 5:
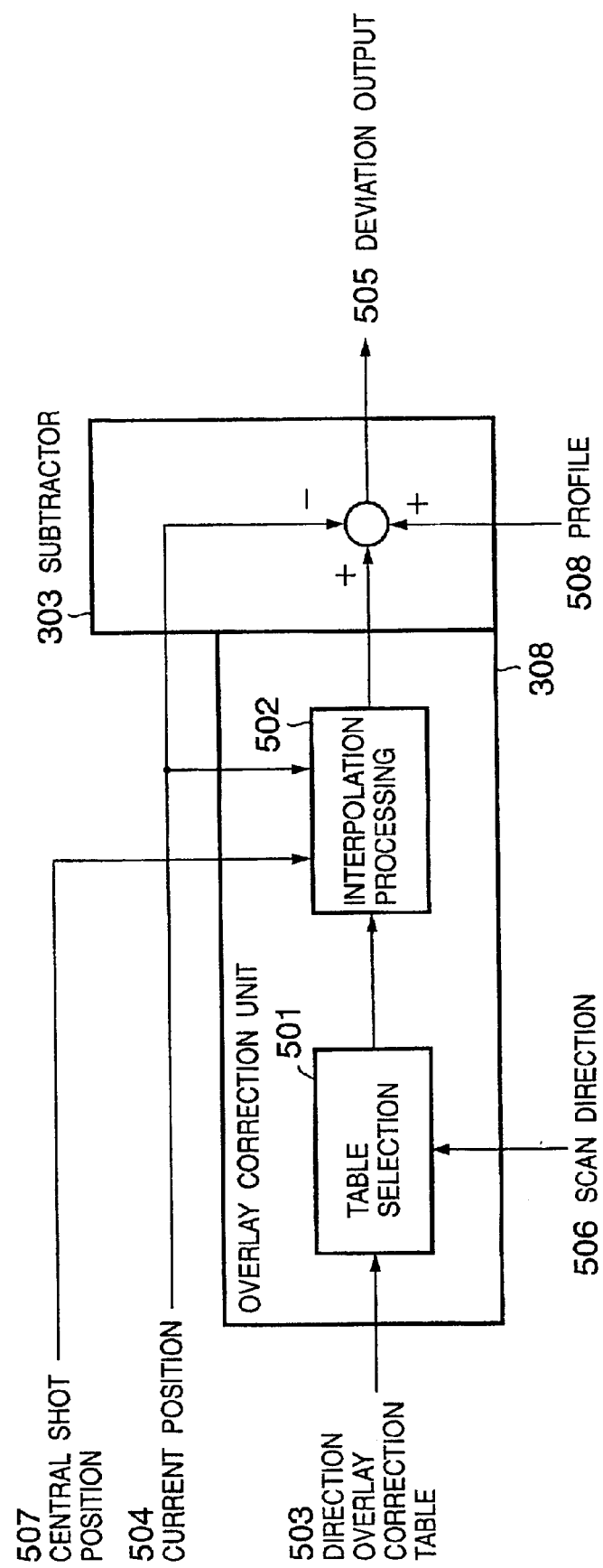
FIG. 5 is a block diagram showing a detailed arrangement of an overlay correction unit and a subtractor in FIG. 3.

FIG. 5 is a block diagram showing a detailed arrangement of the overlay correction unit 308 and subtractor 303 in FIG. 3. A table selector 501 reads a direction overlay correction table 503 (to be described with reference to FIG. 6), and determines an overlay correction table (forward/reverse table) to be used in accordance with a scan direction (forward/reverse) 506 of the wafer stage 16. An interpolation processing unit 502 linearly interpolates the overlay correction table selected by the table selector 501, and calculates a correction amount in accordance with a current position 504 of the wafer stage 16 and a central shot position 507 obtained by the host sequence. The subtractor 303 adds the result to a profile 508 serving as sequential target positions (target locus) provided by the profiler 307, and subtracts the current position 504 of the wafer stage 16 provided by the correction processing unit 302 from the sum, obtaining a deviation output 505. In this example, the sequential target positions (target locus) provided by the profiler 307 are corrected based on the overlay correction table in parallel to exposure operation. This correction may be executed before exposure operation. In this case, corrected target positions (target locus) are saved, and the wafer stage 16 is driven in accordance with the target positions (target locus) in exposure operation.

FIG. 6 shows an example of the direction overlay correction table 503. The direction overlay correction table 503 is provided by, e.g., the user via a terminal (not shown). The origin and data interval of the overlay correction table are preferably variables in order to give flexibility to a measurement reticle for creating a direction overlay correction table. The direction overlay correction table includes two overlay correction tables for "forward" and "reverse" scan directions of the wafer stage 16 in scanning exposure.

The present inventors have made extensive studies to find out that the difference in controlled variables due to the difference in scan direction (so-called scan direction difference) occurs by several nm when processing shifts to exposure with a small relative sync error between the wafer stage 16 and the reticle stage 5, or when the lens barrel surface plate 13 deforms owing to load variations at the position of the reticle stage 5. The overlay accuracy can be increased by reducing the influence of the scan direction difference as a shift generated when forward scanning exposure and reverse scanning exposure are done at the same target value of the shot center, or by positively correcting the shot shape and central shot position in order to establish mix-and-match for a wafer exposed by another type of scanning exposure apparatus which suffers from various shot distortions in accordance with the scan position. The direction overlay correction table may be set in accordance with a reticle used, or may be selected from direction overlay correction tables registered for respective reticles in accordance with a reticle used. If the scan direction difference or shot distortion tends to change depending on the scan speed, the direction overlay correction table may be set in accordance with the scan speed, or a direction overlay correction table corresponding to the scan speed may be selected from direction overlay correction tables registered for respective scan speeds.

Figure 7:
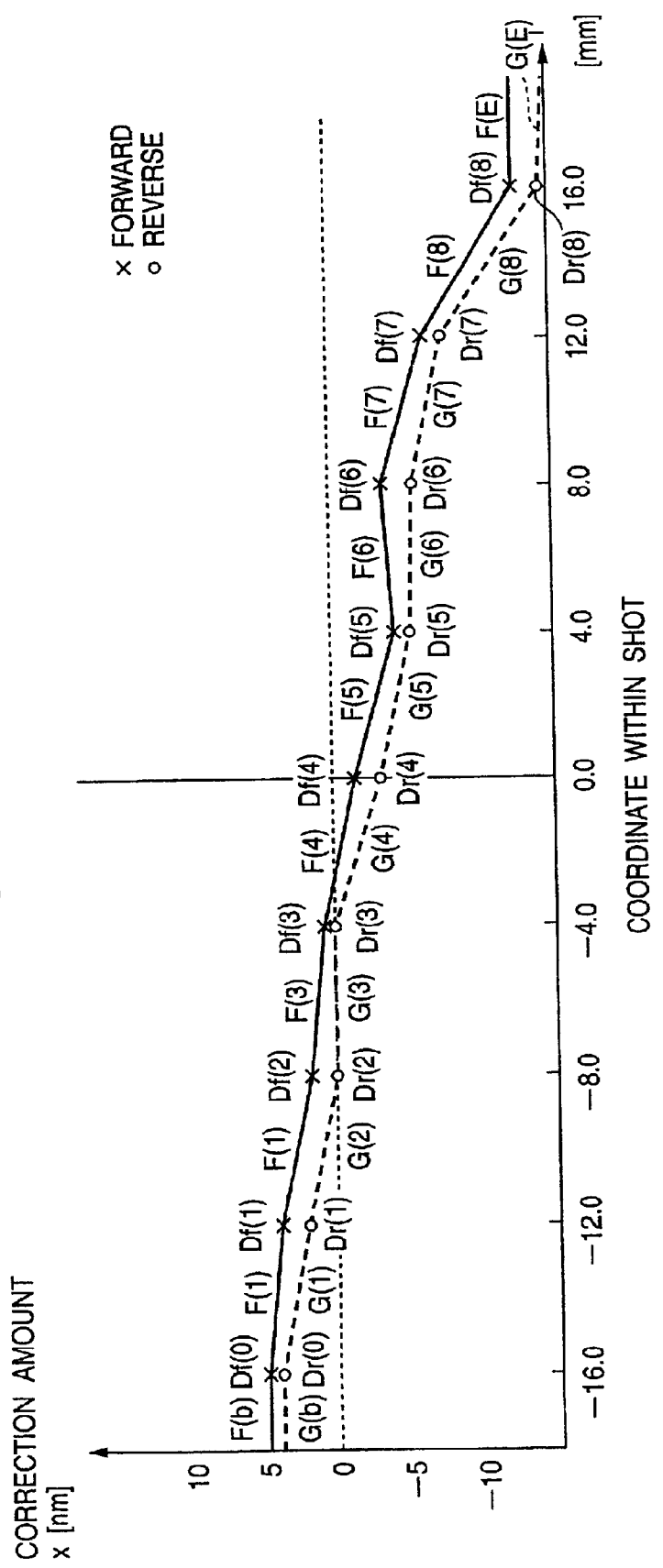
FIG. 7 is a graph showing two correction functions for the X-axis that are attained by linearly interpolating the forward and reverse overlay correction tables of the direction overlay correction table 503 shown in FIG. 6.

FIG. 7 shows two correction functions for the X-axis that are attained by linearly interpolating the forward and reverse overlay correction tables of the direction overlay correction table 503 shown in FIG. 6. The interval between data of the overlay correction table is interpolated by a linear function. Correction values at the two ends of a section where the overlay correction table is defined are set to the same values as correction values at the two ends of the overlay correction table for each adjacent section. This can prevent abrupt changes in target value when the wafer stage 16 comes to the end of the section where the overlay correction table is defined. The correction function is defined for six axes (X, Y, θ, Z, ωx, and ωy) in each of the two, forward and reverse scan directions.

The overlay correction table is interpolated as follows. Letting (Xtgt, Ytgt) be the target value of the central point of the scanning exposure shot, and (xc, yc) be the current coordinate values of the wafer stage 16, a scanning exposure position (yk) in the current shot is given by $$yk = -(yc - Ytgt) \quad (1)$$

Letting Df(k) be data of the forward overlay correction table in the direction overlay correction table 503, Dr(k) be data of the reverse overlay correction table, Org be the origin of the overlay correction table, l be the data interval, F(k) be the linear interpolation function between Df(k−1) and Df(k), and G(k) be the linear interpolation function between Dr(k−1) and Dr(k), correction functions in functional sections partitioned by respective data are given by

| Functional Section | Function | Functional Equation | |
|---|---|---|---|
| yk ≤ Org | F(b) | Df(0) | (2) |
| Org ≤ yk ≤ Org + 1 | F(1) | Df(0) + (Df(1) − Df(0)) (yk − Org)/l | |
| Org + 1 ≤ yk ≤ Org + 2l | F(2) | Df(1) + (Df(2) − Df(1)) (yk − Org − 1)/l | |
| . | . | . | |
| . | . | . | |
| . | . | . | |
| Org + (n − 1)l ≤ yk ≤ Org + nl | F(n) | Df(n − 1) + (Df(n) − Df(n − 1)) (yk − Org − nl)/l | |

-continued

| Functional Section | Function | Functional Equation |
|---|---|---|
| Org + zl ≤ yk | F(E) | Df(z) |

(data of the overlay correction table is up to z) where n is given by $$n=(int)((yk-Org)/l)+1 \quad (3)$$

Reverse correction functions can be obtained based on an equation in which F(n) and Df(n) in equation (2) are respectively replaced by G(n) and Dr(n).

An interpolation method other than the above interpolation method is preferably one using a function of second or higher order or a spline function. If a discrete value is mixed in the overlay correction table and directly used, the wafer stage 16 does not follow the target value, and the sync error between the reticle stage 5 and the wafer stage 16 increases. To prevent this, data which form an overlay correction table may be approximated into a simple shape such as a quadratic function by using the least square method or the like.

Also, when a function which connects correction values formed based on the overlay correction table has a complicated shape with many sharp inflections, the wafer stage 16 does not follow the target value, increasing the sync error. To prevent this, the shift amount at each point is approximated by a low-order polynomial, and the coefficient value of the approximate expression is held for each reticle, instead of holding the shift amount at each point for each reticle in the above-mentioned table form.

Figure 8:
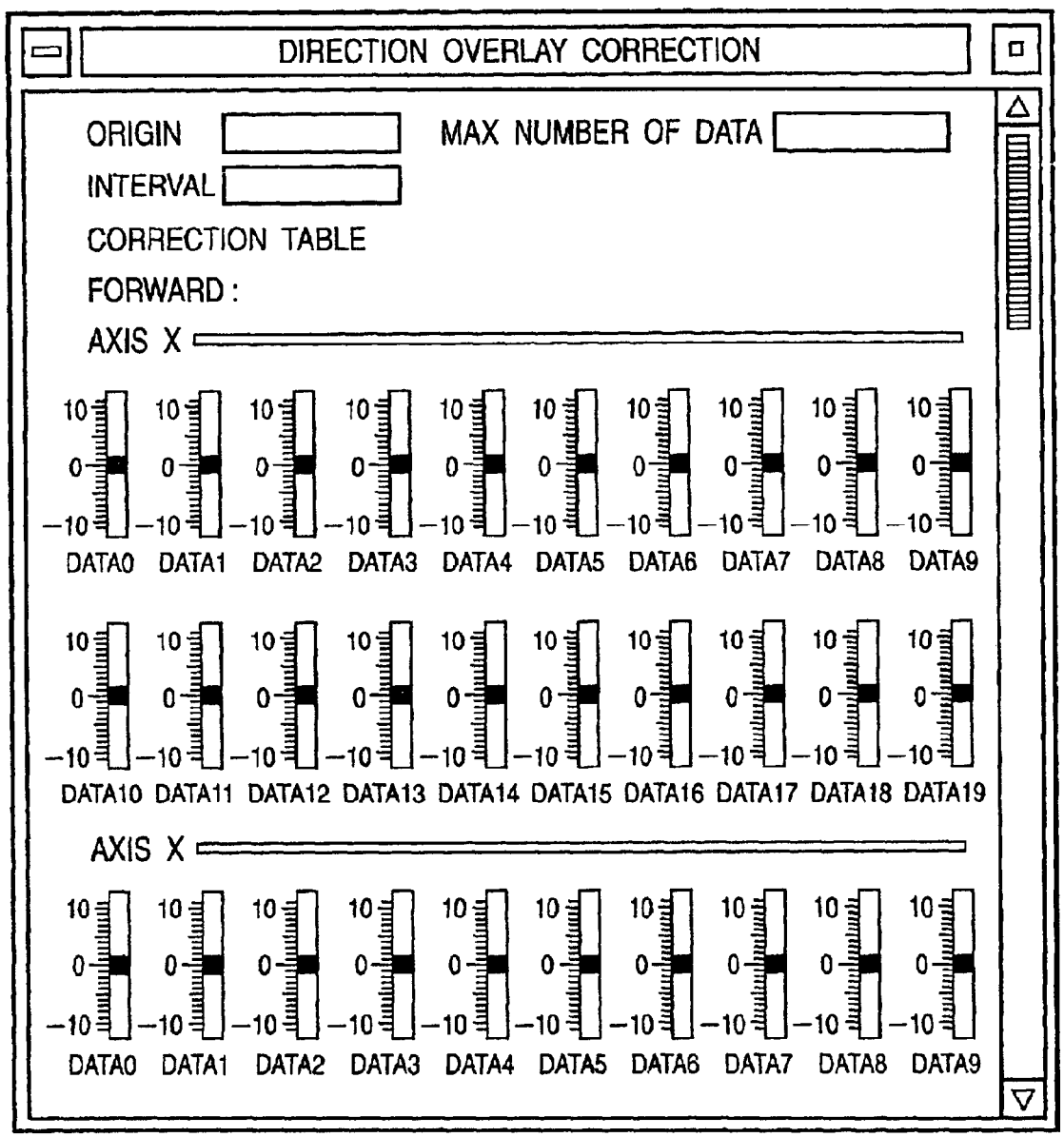
FIG. 8 is a view showing an example of a user interface for setting the direction overlay correction table.

FIG. 8 is a view showing an example of a user interface for setting the direction overlay correction table. This user interface is provided by software installed in a terminal connected to the exposure apparatus. To define one direction overlay correction table, the user interface allows setting the origin of table data common to respective control axes, the data interval, and the maximum number of data. In the example shown in FIG. 8, twenty data (data 0 to data 19) can be set per axis at a maximum. The data interval and the number of data are typically defined to cover the exposure shot range or the range including the pre-scan region in addition to the exposure shot region. Entry of data exceeding the maximum number of data is ignored. In one direction overlay correction table, data entries for six axes are preferably prepared for each of the two scan directions.

The direction overlay correction table is used (1) to ensure the absolute shape and layout reproducibility of the shot in the exposure apparatus (i.e., to correct an alignment error caused by the machine), (2) to correct a mask deformation or manufacturing error (this appears as a shape characteristic such as the distortion of a pattern formed on the mask) (i.e., to correct an alignment error caused by the mask), and (3) to positively distort a pattern to be transferred or change the central position in accordance with the shape characteristic such as the distortion of a pattern formed on a wafer to be exposed (i.e., to correct an alignment error caused by the process).

The machine-caused alignment error may be caused by the distortion of the reticle due to a processing accuracy of a reticle-chucking portion of the reticle stage. The machine-caused alignment error may also occur when the positional relationship between the reticle and the mirror of the reticle stage and the positional relationship between the wafer and the mirror of the wafer stage change with a large time constant. Of machine-caused alignment errors, the reproducibility error is measured in assembling and adjusting the exposure apparatus. A direction overlay correction table for correcting this error is created on the basis of the measurement result and saved in a memory medium such as the hard disk of the exposure apparatus. In exposure, the target locus of the wafer stage 16 is corrected based on the direction overlay correction table. As for a machine-caused alignment error generated after assembly/adjustment, for example, a pattern is formed on a wafer by using a measurement reticle (exposure, developing, etching, and the like), and a direction overlay correction table for correcting this error is created on the basis of the result. The target locus of the wafer stage 16 is corrected based on the direction overlay correction table, thereby correcting the error.

The mask-caused alignment error may occur when the reticle deforms owing to that stress of a pellicle attached to the reticle, which acts on the reticle. As for the mask-caused alignment error, for example, a pattern is formed on a wafer by using the reticle, and a direction overlay correction table for correcting the error is created on the basis of the result (shape characteristic such as the distortion of the formed pattern). The target locus of the wafer stage 16 is corrected based on the direction overlay correction table, thereby correcting the error.

The process-caused alignment error may occur when an underlayer is exposed by using an exposure apparatus having a machine-caused alignment error or a deformed reticle. As for the process-caused alignment error, a direction overlay correction table for correcting the error is created on the basis of the shape characteristic such as the distortion of a pattern formed by an exposure apparatus for forming an underlayer. The target locus of the wafer stage 16 is corrected based on the direction overlay correction table, thereby correcting the error.

To correct all the machine-, mask-, and process-caused alignment errors, a direction overlay correction table for correcting the machine-caused alignment error, that for correcting the mask-caused alignment error, and that for correcting the process-caused alignment error are effectively synthesized into a new direction overlay correction table.

Figure 10:
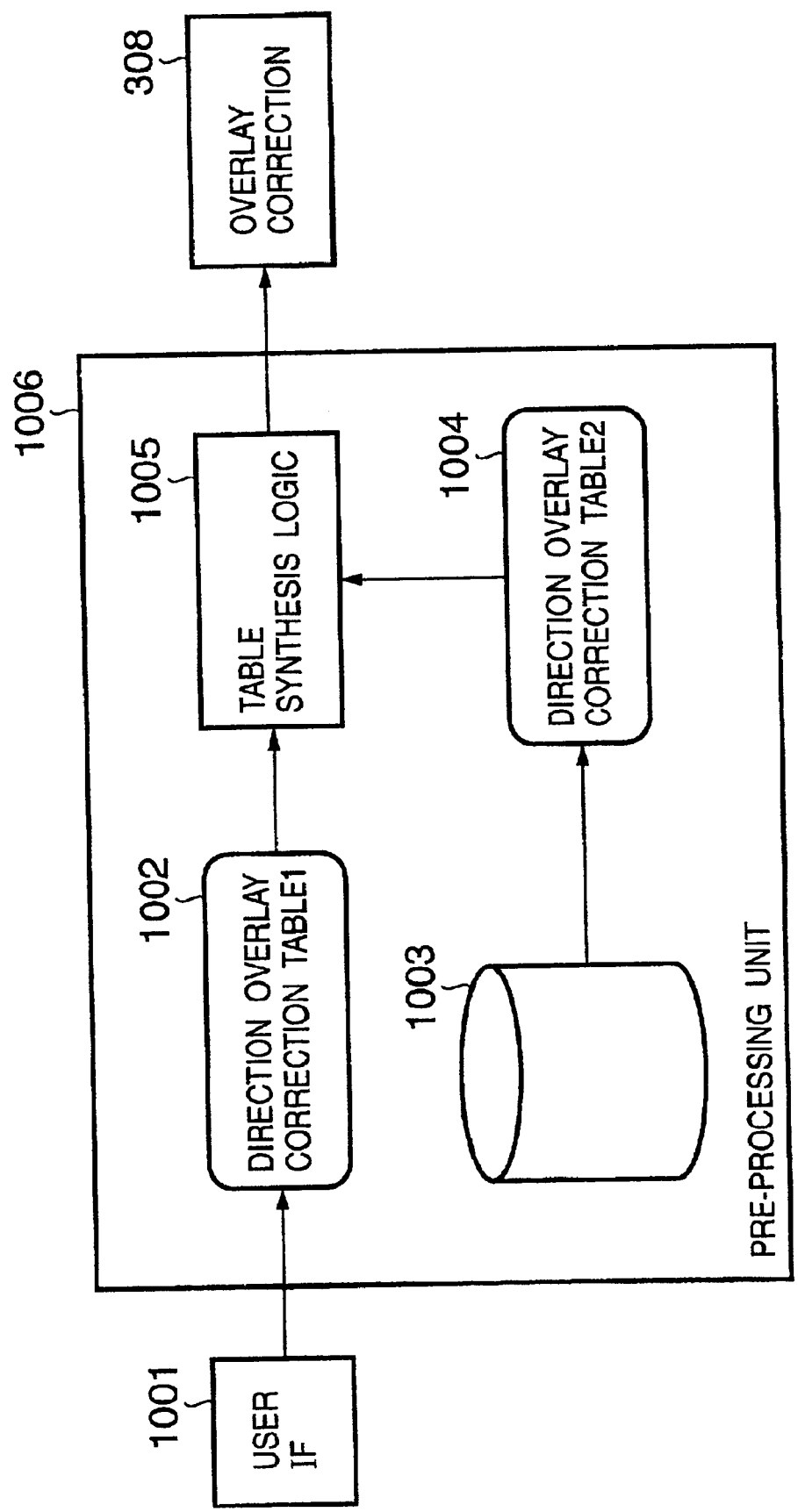
FIG. 10 is a block diagram for explaining a method of synthesizing two direction overlay correction tables as an example of a method of synthesizing a plurality of direction overlay correction tables.

FIG. 10 is a block diagram for explaining a method of synthesizing two direction overlay correction tables as an example of the method of synthesizing a plurality of direction overlay correction tables. A first direction overlay correction table 1002 input from a user interface 1001 as shown in FIG. 8 is used to correct a process-caused error. A second direction overlay correction table 1004 is used to correct a machine-caused error. The second direction overlay correction table 1004 is measured in factory adjustment, saved in a hard disk 1003 of a pre-processing unit 1006 in the exposure apparatus shown in FIG. 1, and read out in operating the exposure apparatus. The first and second direction overlay correction tables are synthesized (e.g., added) by a table synthesis logic 1005. The synthesized direction overlay correction table is provided to the overlay correction unit 308.

In the above example, error factors are classified into machine and process factors, but may be classified finely or in accordance with another classification method. In this case, direction overlay correction tables are created for respective factors and synthesized.

Figure 9:
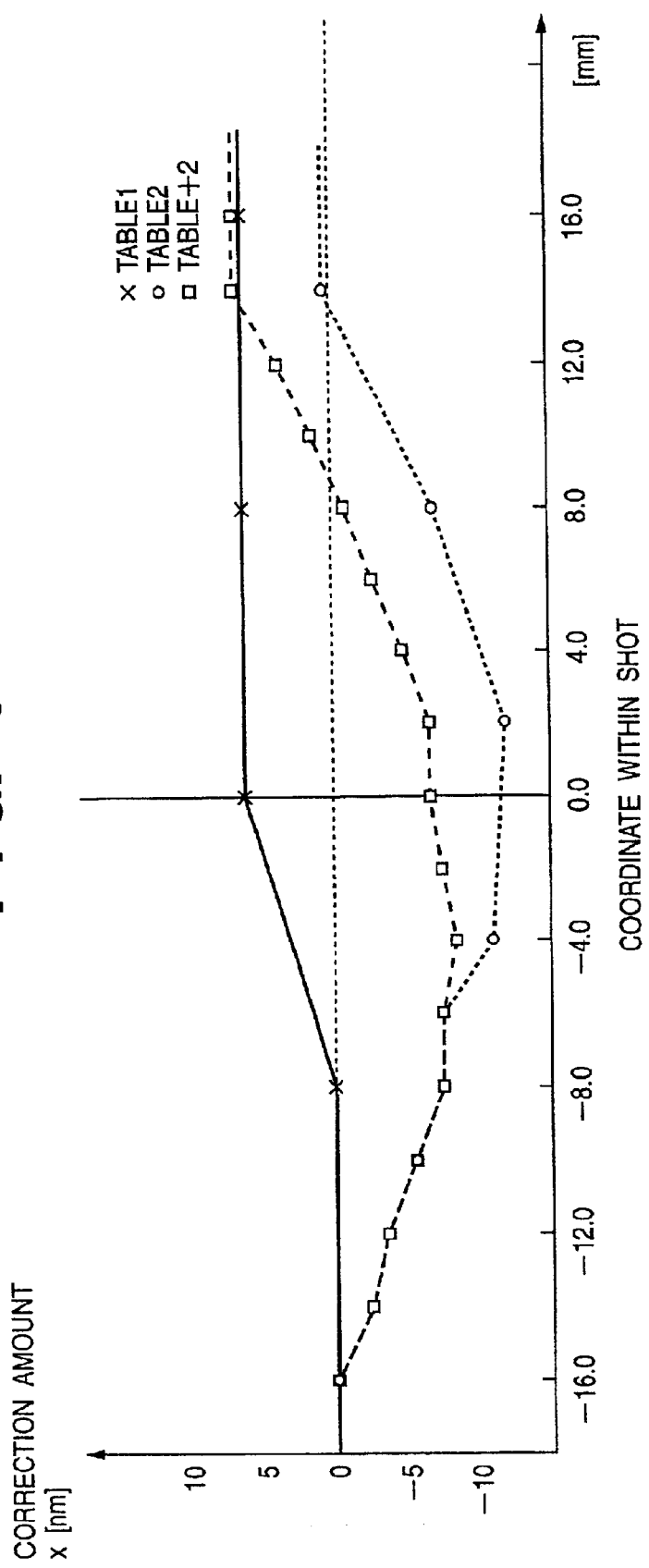
FIG. 9 is a graph showing an example of the distribution shapes of correction amounts in the first and second direction overlay correction tables and their synthesized direction overlay correction table in FIG. 10.

FIG. 9 is a graph showing an example of the distribution shapes of correction amounts in the first and second direction overlay correction tables and their synthesized direction overlay correction table in FIG. 10. The second direction overlay correction table set in factory adjustment and the first direction overlay correction table set by the user must assume different table origins and intervals because the pattern used to measure a distortion within an exposure shot depends on the reticle. That is, data of the two tables cannot always be simply added. When the two tables have different origins and intervals, the origin and interval of a synthesized direction overlay correction table are determined. Then, the first and second direction overlay correction tables are interpolated to generate data corresponding to the determined origin and interval. The generated data are synthesized to create a synthesized direction overlay correction table. In general, the second direction overlay correction table for correcting a machine-caused error is rarely changed after measurement is performed only once and the absolute layout precision of the scanning exposure shot is adjusted to fall within the allowable value. The first direction overlay correction table for correcting a process-caused error is set based on the measurement result every time the user process changes (including change of the reticle).

Figure 11:
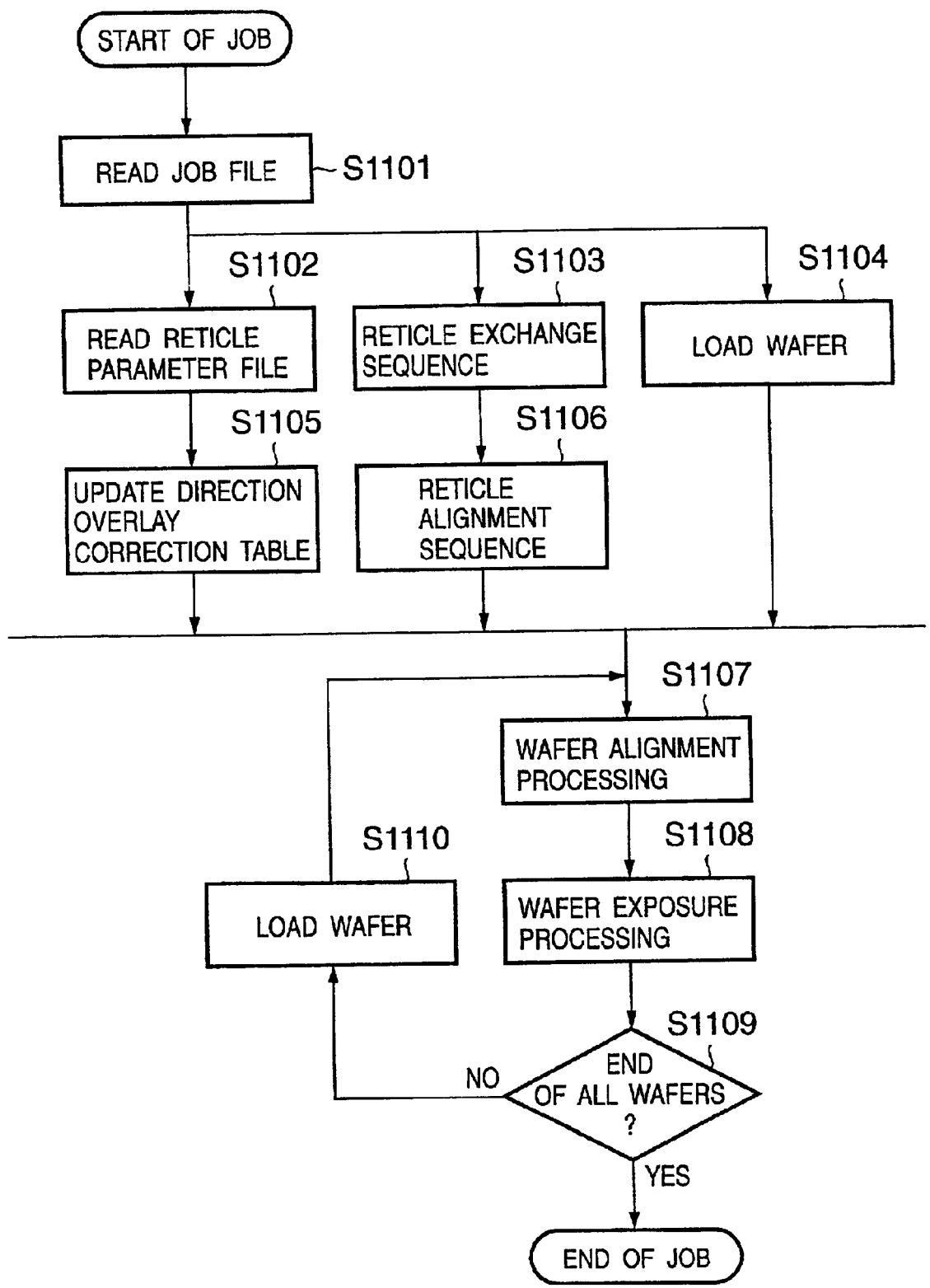
FIG. 11 is a flow chart showing a job processing sequence in the exposure apparatus according to the preferred embodiment of the present invention.

FIG. 11 is a flow chart showing a job processing sequence in the exposure apparatus according to the preferred embodiment of the present invention. If the job starts, a control device for controlling the exposure apparatus reads out a job file which defines the shot layout, shot size, and exposure amount of a wafer, the reticle index, and the like from a data storage in the exposure apparatus or a file server on a network into the memory of the control device in step S1101. Steps S1102 and S1105, steps S1103 and S1106, and step S1104 are parallel-executed.

In step S1102, the control device loads a reticle parameter file corresponding to a reticle designated in the job file. This reticle parameter file describes parameters depending on the reticle, e.g., reticle alignment mark information and the exposure light transmittance of the reticle. The reticle parameter file preferably includes the above-described direction overlay correction table. By giving the reticle parameter file the direction overlay correction table, the target positions (target locus) of the wafer stage 16 can be corrected in scanning exposure for each reticle. Also, when the direction overlay correction table is loaded as another file in accordance with the reticle designated in the job file, the target positions (target locus) of the wafer stage can be corrected in scanning exposure for each reticle.

In step S1105, the loaded direction overlay correction table is transferred to the memory 309 in the control unit shown in FIG. 3.

In step S1103, the reticle used in the previous job is exchanged for another one designated in the job file under the control of the control device. In step S1106, the exchanged reticle is aligned under the control of the control device, thereby accurately specifying a position where the pattern of the reticle is to be drawn. If necessary, the exposure light transmittance is also measured.

In step S1104, a wafer is loaded under the control of the control device in parallel with loading of the reticle parameter file and exchange of the reticle.

After steps S1104, S1105, and S1106 end, wafer alignment measurement processing is executed under the control of the control device in step S1107. In step S1108, the target positions (target locus) of the wafer stage 16 are corrected by the overlay correction unit 308 on the basis of the direction overlay correction table under the control of the control device. Exposure processing is performed while the wafer stage 16 is driven in accordance with the corrected target positions (target locus). In step S1109, the control device checks whether exposure processing ends for all the wafers designated as the job. If NO in step S1109, the control device loads the next wafer in step S1110 and repeats the sequence from step S1107. If YES in step S1109, the job ends.

In the above embodiment, the target positions (target locus) of the wafer stage 16 are corrected in accordance with the reticle. In addition to or instead of this, the target positions (target locus) of the reticle stage 5 may be corrected in accordance with the reticle.

In addition to or instead of this, another controlled element, e.g., the target value or target locus (e.g., projection magnification) of an optical system such as a projection lens may be corrected in accordance with the reticle.

An embodiment of a device production method using an exposure apparatus represented by the scanning exposure apparatus described in the above embodiment will be explained.

Figure 12:
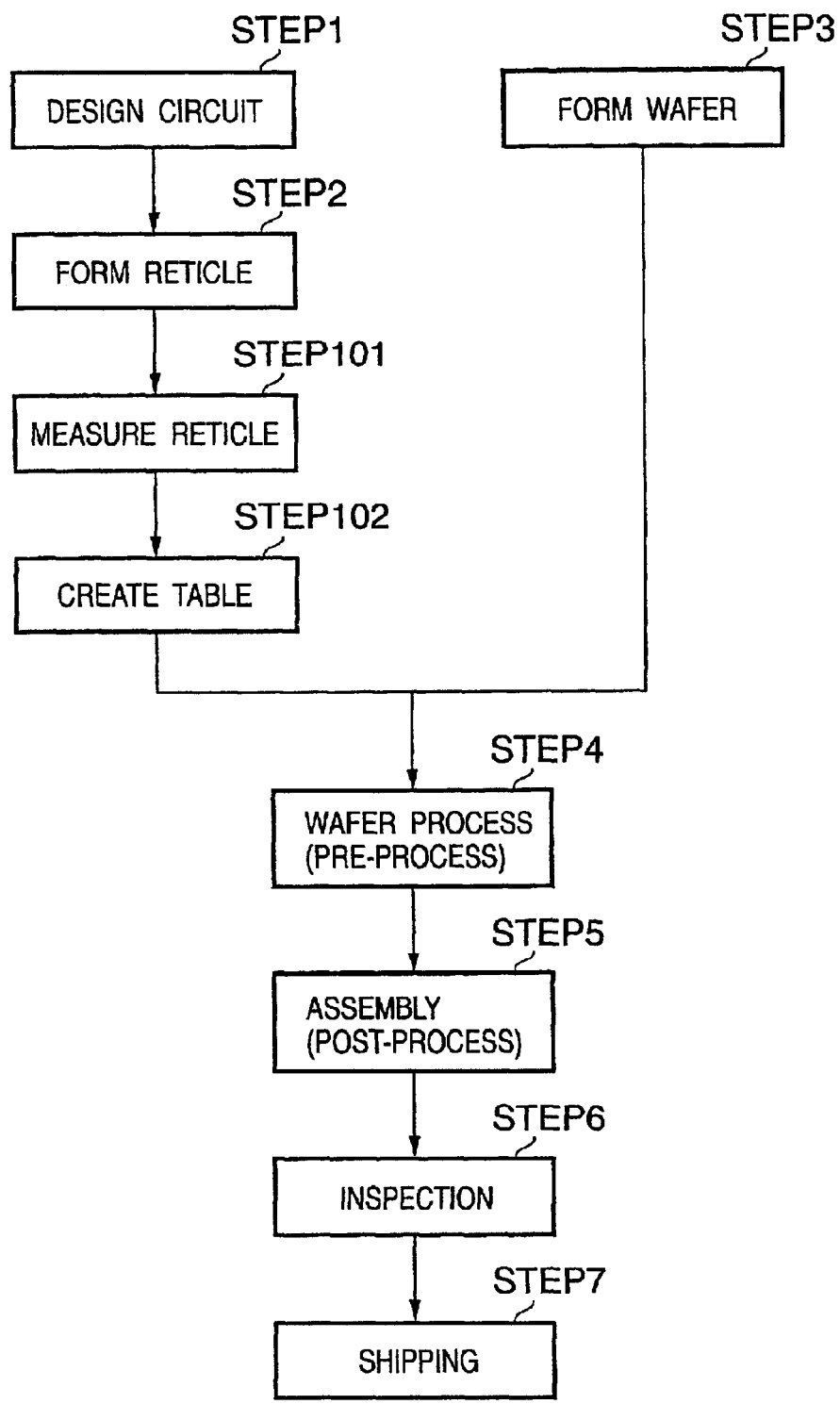
FIG. 12 is a flow chart showing manufacturing flow for a microdevice (e.g., a semiconductor chip such as an IC or LSI, a liquid crystal panel, a CCD, a thin-film magnetic head, a micromachine, or the like)

FIG. 12 is a flow chart showing a manufacturing flow for a microdevice (e.g., a semiconductor chip such as an IC or LSI, a liquid crystal panel, a CCD, a thin-film magnetic head, a micromachine, or the like). In step 1 (circuit design), a semiconductor device circuit is designed.

In step 2 (reticle formation), a reticle is formed on the basis of the designed circuit pattern. In step 101, information for creating a direction overlay correction table is acquired by setting the formed reticle in the exposure apparatus, actually executing exposure processing, and evaluating the exposure result, by evaluating a shape characteristic such as the deformation of the formed reticle or the manufacturing error, or by another appropriate method. It is also effective to acquire information for creating another direction overlay correction table by evaluating a shape characteristic such as the deformation of a pattern on a wafer to be exposed to the reticle pattern in order to perform mix-and-match. In step 102, a direction overlay correction table for the reticle is set by using, e.g., the user interface shown in FIG. 8 on the basis of the information acquired in step 101.

In step 3 (wafer formation), a wafer is formed by using a material such as silicon. In step 4 (wafer process), called a pre-process, an actual circuit is formed on the wafer by lithography including the step of setting the reticle in the exposure apparatus and transferring the reticle pattern onto the wafer while correcting the target value of a controlled element such as the stage in accordance with the reticle. Step 5 (assembly), called a post-process, is the step of forming a semiconductor chip by using the wafer formed in step 4, and includes an assembly process (dicing and bonding), and a packaging process (chip encapsulation). In step 6 (inspection), inspections such as the operation confirmation test and durability test of the semiconductor device manufactured in step 5 are conducted. After these steps, the semiconductor device is completed and shipped (step 7).

Figure 13:
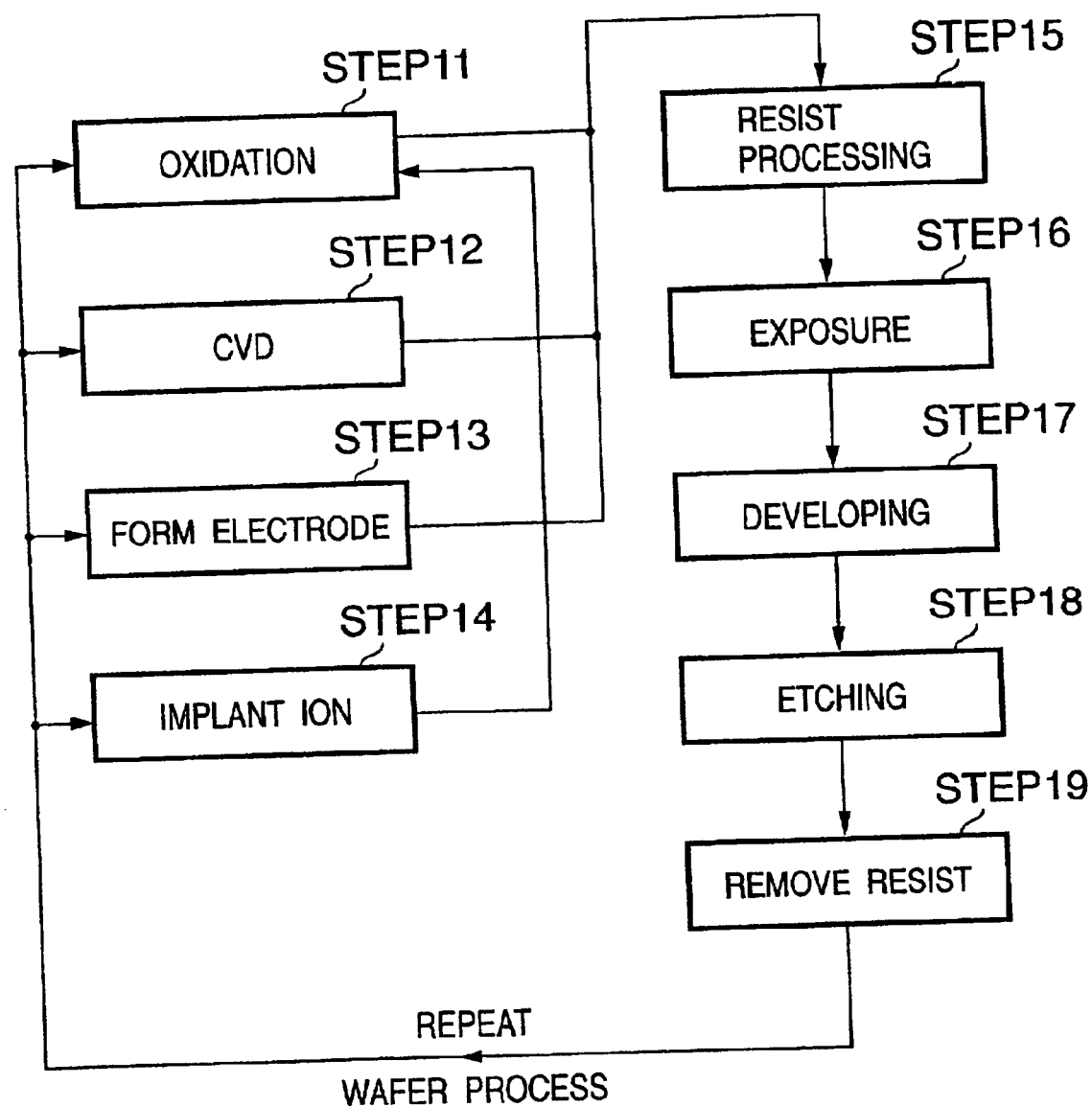
FIG. 13 is a flow chart showing the detailed flow of the wafer process shown in FIG. 12.

FIG. 13 shows the detailed flow of the wafer process shown in FIG. 12. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the circuit pattern is transferred to the wafer by the exposure apparatus while the target value of the controlled element such as the stage is corrected in accordance with the reticle. In step 17 (developing), the wafer bearing the pattern is developed. In step 18 (etching), the resist is etched except for the developed resist image. In step 19 (resist removal), an unnecessary resist after etching is removed. These steps are repeated to form multiple circuit patterns on the wafer. The exposure step (step 16) executed a plurality of number of times in order to form multiple circuit patterns can use different types of exposure apparatuses (mix-and-match). At this time, the target position of the controlled element such as the stage can be so corrected as not to generate any overlay error by the difference in type.

The manufacturing method according to the embodiment can manufacture a highly integrated semiconductor device at low cost, which is difficult to manufacture by a conventional method.

The present invention can increase the overlay accuracy.

As many apparently widely different embodiments of the present invention can be made/without departing from the spirit and scope thereof, it is to be understood that the invention is not limited to the specific embodiments thereof except as defined in the claims.

What is claimed is:

1. An exposure method of transferring a master pattern onto a substrate while moving a controlled element concerning exposure operation, comprising:

transferring the master pattern onto the substrate while moving the controlled element in accordance with a target locus generated in correspondence with a shape characteristic of the mask pattern and a shape characteristic of a pattern already formed on the substrate.

2. A device manufacturing method comprising:

the first coating step of coating a substrate with a first resist;

the first exposure step of transferring a first master pattern onto the substrate coated with the first resist;

the first developing step of developing the substrate bearing the first master pattern;

the second coating step of coating the developed substrate with a second resist;

the second exposure step of transferring a second master pattern onto the substrate coated with the second resist; and the second developing step of developing the substrate bearing the second master pattern, wherein the second exposure step includes the correction step of correcting a target locus of a controlled element concerning exposure operation on the basis of correction information corresponding to a shape characteristic of the second master pattern and/or a shape characteristic of a pattern formed on the substrate after the first developing step, and the transfer step of transferring the second master pattern onto the substrate while moving the controlled element toward the corrected target locus.

3. The method according to claim 2, wherein different types of exposure apparatuses are used in the first and second exposure steps.

4. An exposure method of transferring a pattern onto a substrate while moving an element concerning the transfer, said method comprising a step of:

transferring a second pattern onto the substrate, onto which a first pattern has been transferred, while moving the element based on information prepared with respect to each position of the element for correcting an overlay error between the first and second patterns.

5. A method according to claim 4, wherein the information is prepared with respect to at least one of a group of a shape characteristic of the first pattern already transferred onto the substrate, a shape characteristic of the second pattern, a characteristic of an exposure apparatus used for the transfer, a direction in which the element is to be moved, and a speed at which the element is to be moved.

6. A method according to claim 5, further comprising a step of synthesizing first and second information, the first and second information being prepared as information with respect to each of two of a shape characteristic of the first pattern already transferred onto the substrate, a shape characteristic of the second pattern, and a characteristic of an exposure apparatus used for the transfer, wherein in said transferring step the element is moved based on information obtained in said synthesizing step.

7. A method according to claim 5, wherein the shape characteristic of the second pattern is obtained based on a master to be used of the transfer.

8. A method according to claim 4, further comprising a step of providing a user interface for setting the information.

9. A method according to claim 4, wherein the element includes at least one of the substrate, a master having a second pattern and an element of an optical system.

10. An exposure apparatus for transferring a pattern onto a substrate while moving an element concerning the transfer, said apparatus comprising:

a moving unit which moves the element; and a control unit which controls said moving unit so as to move the element based on information prepared with respect to each position of the element for correcting an overlay error between first and second patterns during transferring the second pattern onto the substrate onto which the first pattern has been transferred.

11. An apparatus according to claim 10, wherein the information is prepared with respect to at least one of a group of a shape characteristic of the first pattern already transferred onto the substrate, a shape characteristic of the second pattern, a characteristic of said exposure apparatus used for the transfer, a direction in which the element is to be moved, and a speed at which the element is to be moved.

12. An apparatus according to claim 10, further comprising a synthesizing unit which synthesizes first and second information, the first and second information being prepared as the information with respect to each of the two of a shape characteristic of the first pattern already transferred onto the substrate, a shape characteristic of the second pattern, and a characteristic of an exposure apparatus used for the transfer, wherein said control unit controls said moving unit so as to move the element based on information obtained by said synthesizing unit.

13. An apparatus according to claim 11, wherein the shape characteristic of the second pattern is loaded based on a master designated in a job file.

14. An apparatus according to claim 10, further comprising a system which provides a user interface for setting the information.

15. An apparatus according to claim 10, wherein the element includes at least one of the substrate, a master having the second pattern and an element of an optical system.

16. A device manufacturing method comprising a step of transferring a second pattern onto a substrate, onto which a first pattern has been transferred, using a second exposure apparatus defined in claim 10.

17. A method according to claim 16, wherein the first pattern has been transferred using a first exposure apparatus different from the second exposure apparatus.

18. An exposure method of scan-exposing a surface of a substrate placed on a substrate stage to a pattern of an original placed on an original stage through a projection optical system, said method comprising steps of:

setting a target locus, of the substrate stage, corresponding to the original;

preparing a correction table for correcting a shape error of a pattern of the original formed on the substrate; and correcting the target locus of the substrate stage based on the correction table.

19. An exposure method of scan-exposing a surface of a substrate placed on a substrate stage to a pattern of an original placed on an original stage through a projection optical system, said method comprising:

setting a target locus, of the original stage, corresponding to the original;

preparing a correction table for correcting a shape error of a pattern of the original formed on the substrate; and correcting the target locus of the original stage based on the correction table.

* * * * *

UNITED STATES PATENT AND TRADEMARK OFFICE
CERTIFICATE OF CORRECTION

PATENT NO. : 6,870,599 B2  Page 1 of 1
DATED : March 22, 2005
INVENTOR(S) : Hiroshi Kurosawa It is certified that error appears in the above-identified patent and that said Letters Patent is hereby corrected as shown below:

<u>Column 13,</u>
Line 10, "made/without" should read -- made without --.
Line 37, "includes" should read -- includes: --.

<u>Column 14,</u>
Line 23, "transferring" should read -- transferring of --.

Signed and Sealed this

Thirteenth Day of September, 2005

JON W. DUDAS
*Director of the United States Patent and Trademark Office*